US008752108B2

(12) United States Patent
Bouchard

(10) Patent No.: US 8,752,108 B2
(45) Date of Patent: Jun. 10, 2014

(54) SYSTEM AND METHOD FOR DETECTING SIGNAL INGRESS INTERFERENCES

(76) Inventor: Magella Bouchard, Outremont (CA)

( * ) Notice: Subject to any disclaimer, the term of this patent is extended or adjusted under 35 U.S.C. 154(b) by 131 days.

(21) Appl. No.: 13/187,545

(22) Filed: Jul. 21, 2011

(65) Prior Publication Data

US 2012/0047544 A1 Feb. 23, 2012

Related U.S. Application Data

(60) Provisional application No. 61/366,393, filed on Jul. 21, 2010, provisional application No. 61/370,164, filed on Aug. 3, 2010.

(51) Int. Cl.
*H04N 7/173* (2011.01)
*G01R 31/28* (2006.01)

(52) U.S. Cl.
USPC ............................ 725/107; 725/125; 324/528

(58) Field of Classification Search
None
See application file for complete search history.

(56) References Cited

U.S. PATENT DOCUMENTS

| | | | | |
|---|---|---|---|---|
| 4,520,508 | A | 5/1985 | Reichert | |
| 5,596,330 | A * | 1/1997 | Yokev et al. | 342/387 |
| 5,608,428 | A | 3/1997 | Bush | |
| 5,777,662 | A | 7/1998 | Zimmerman | |
| 6,018,358 | A | 1/2000 | Bush | |
| 6,166,760 | A | 12/2000 | Kay | |
| 6,292,944 | B1 | 9/2001 | Harris | |
| 6,804,826 | B1 | 10/2004 | Bush et al. | |
| 6,833,859 | B1 | 12/2004 | Schneider et al. | |
| 6,978,476 | B2 | 12/2005 | Zimmerman | |
| 7,360,124 | B2 * | 4/2008 | Bouchard | 714/47.3 |
| 7,395,548 | B2 | 7/2008 | Runzo et al. | |
| 7,945,939 | B2 * | 5/2011 | Eckenroth et al. | 725/148 |
| 8,143,900 | B2 * | 3/2012 | Shimp et al. | 324/527 |
| 8,154,303 | B2 * | 4/2012 | Maxson et al. | 324/532 |
| 8,269,571 | B2 * | 9/2012 | Bare | 332/149 |
| 2006/0248565 | A1 | 11/2006 | Shimp et al. | |
| 2011/0285400 | A1 * | 11/2011 | Defoort et al. | 324/512 |

* cited by examiner

*Primary Examiner* — Chris Parry
(74) *Attorney, Agent, or Firm* — Benoît & Côté Inc.

(57) ABSTRACT

A system and method for detecting and geo-locating signal ingress interferences in a cable distribution network comprising a head station for transmitting content to subscribers at frequencies within a network bandwidth. The system comprises a vehicle mounted geo-locating device for generating geo-location data indicating the geographical position of a vehicle, and a vehicle mounted transmitter for transmitting a radio-frequency signal comprising said geo-location data at a frequency within the network bandwidth as the vehicle travels within the geographical area of the network. If an ingress exists in the network, the ingress signal sent from onboard the vehicle would leak into the network to be received and detected by a receiver at the head station of the cable distribution network. A server is used to process the data extracted by the receiver to produces reports and maps reflecting ingress points in a geographical area.

17 Claims, 5 Drawing Sheets

SYSTEM AND METHOD FOR DETECTING SIGNAL INGRESS INTERFERENCES

CROSS-REFERENCE TO RELATED APPLICATIONS

This application claims priority from U.S. Provisional Application No. 61/366,393 filed on Jul. 21, 2010 and U.S. Provisional Application No. 61/270,164 filed on Aug. 3, 2010. Both applications are incorporated herein by reference in their entirety.

BACKGROUND (a) Field

The subject matter disclosed generally relates to a system and method for detecting signal ingress interferences in a cable distribution network.

(b) Related Prior Art

Among the more difficult problems faced by the broadband cable industry are those caused by signal leakage and ingress interferences. These interferences are caused by improper or defective RF shielding of passive or active components connected to the coaxial network. When signal leakage is present, it could cause potential impairments to licensed over-the-air services. When ingress interference is present, it could cause potential impairments to cable television data services. Ingress interfering signals can be generated by electromagnetic interference (EMI), radio-frequency interference (RFI) or TV interference (TVI).

Ingress by over-the-air signals can come from many sources such as regulated radio transmitters, Amateur Radio and military users. In addition to these licensed operators, there are even more sources of radio energy or noise. FCC's Part 15 regulations govern license-free transmitters used in walkie-talkies, video games, garage door openers, modulators and other unlicensed low-power radio transmitters. Unintentional sources of noise include computer equipment, microprocessor circuits used in consumer electronics equipment, motors, neon signs, thermostats, the electrical power distribution system, etc.

When the shield integrity is compromised, in addition to the problems associated with signal leakage, ingress interference is primarily manifested as a disturbance that can affect the subscriber's TV analog/digital reception, High Speed Data (HSD) or Voice-over-IP (VoIP) services. The resultant service costs (or lost subscribers) represent a financial loss to the broadband cable operator.

One of the first methods for ingress detection in the 5-42 MHz return band involves utilizing a spectrum analyzer at the head-end connected to a return path test point. The process requires a head-end technician and a plant maintenance technician to disconnect specific portions of the plant to locate source of ingress.

More recent methods have automated this manual process by dedicating or switching return path test points to a network based RF monitoring system located at the head-end, which provides return node visibility to a Network Operation Center. All return nodes would be tested and monitored by a centralized Network Operation Center (NOC). Once ingress impairment is detected by the NOC, a system maintenance ticket is issued to plant maintenance crew. Troubleshooting ingress can now be a one-man operation since plant maintenance technicians have visibility on return nodes spectrum using a hand-held meter which receives its data information through a forward path carrier.

Once ingress impairment is detected on a specific return node, the technician needs to identify from which segment of the node the ingress impairment is generated. To do so, the technician needs to utilize the 'divide and conquer' approach. Starting at the node, return pads are either removed/switched in value from each feeder leg until ingress disappears. Once the feeder leg contributing to the ingress impairment is identified, the search is narrowed down to a distribution area.

The technician then moves on to the next active device and repeats the process until he identifies the plant section from which ingress is coming. It may take a few iterations before isolating the ingress to a single distribution leg. At this point of the process, the technician will have to either remove or switch components (coupler boards, tap/coupler plates) to pinpoint ingress source. Removal of these components could be service disruptive if operator is not using RF/AC bypass taps.

Several problems are associated with the detection methods described above. For instance, If the technician is not using RF/AC bypass taps when performing the repairs, all subscribers living in the distribution area under ingress troubleshooting could have their Digital TV, HSD and VoIP services interrupted.

The detection methods are also time consuming because it may take the NOC few hours to confirm that a problem exists at the head-end. It could also take hours for troubleshooting the distribution network before finalizing location of defective component. Finally, it could take days to isolate ingress in the field depending on whether the ingress impairment is intermittent or not.

Therefore, there is a need for a new method for detecting signal ingress interferences which is time efficient before starting to cause problems to customers.

SUMMARY

According to an aspect, there is provided a system for locating a signal ingress point within a cable distribution network, the cable distribution network comprising a head station for transmitting content to subscribers at frequencies within a network bandwidth. The system comprises a vehicle mounted geo-locating device for generating geo-location data indicating a geographical position of the vehicle; a vehicle mounted transmitter operatively connected to the geo-locating device for transmitting a radio signal comprising the geo-location information using a carrier frequency within the network bandwidth; and a receiver at the head station of the cable distribution network, for receiving the radio signal, and extracting the geo-location information to determine the location of the signal ingress point within the cable distribution network.

In an embodiment, the carrier frequency is unused by the cable distribution network.

The system may further comprise a server for processing the extracted geo-location information and identifying an ingress within the cable distribution network. The server may be adapted to eliminate duplicates of the same ingress to avoid sending more than one repair team to the same ingress.

The transmitter may use different carrier frequencies with adjacent distribution networks.

In a further embodiment, the system may comprise a server having access to a database for recording ingress/leak events in the database, said server being adapted to generate an event map illustrating ingress/leak events within a geographical area using the ingress/leak events stored in the database.

In yet another embodiment, the radio signal transmitted by the transmitter comprises identification information of the vehicle.

In a further embodiment, the receiver measures a power level of said radio signal and the server compares power levels of successive signals sent by the same vehicle to determine an approximate location of ingress.

The radio signal may be modulated using Differential Binary Phase-Shift Keying (DBPSK) modulation. Also, the network bandwidth may be between 5 and 42 MHZ and the carrier frequencies are selected from: 6.78 MHz, 13.56 MHZ, and 27.12 MHZ.

In a further aspect, there is provided a method for locating a signal ingress point within a cable distribution network, the cable distribution network comprising a head station for transmitting content to subscribers at frequencies within a network bandwidth. The method comprises:

transmitting from a vehicle, geo-location information indicating a geographical position of the vehicle in a radio signal having a carrier frequency within the network bandwidth;

receiving the radio signal at the head station of the cable distribution network; and extracting the geo-location information from said radio signal to determine the location of the signal ingress point within the cable distribution network.

The method may further include sending vehicle identification information along with said geo-location data.

In an embodiment, the method may comprise storing ingress/leak events and geographical positions associated therewith in a database and generating an event map illustrating ingress/leak events within a geographical area.

In yet a further aspect, there is provided a kit for locating a signal ingress point within a cable distribution network, the cable distribution network comprising a head station for transmitting content to subscribers at frequencies within a network bandwidth, the kit comprising: a transmitter for mounting on a vehicle for transmitting a radio signal comprising geo-location information indicating a geographical position of the vehicle, using a carrier frequency within the network bandwidth; a receiver for installing at the head station of said cable distribution network for receiving said radio signal and extracting said geo-location information; and a memory having recoded thereon statements and instructions for execution by a computer to cause the computer to process the geo-location information to determine an approximate location of said signal ingress point within the cable distribution network.

In an embodiment, the kit may comprise a geo-locating device for mounting on the vehicle for generating the geo-location information.

In another embodiment, the computer determines the approximate location of the signal ingress point based on the power level of successive radio signals sent by the same vehicle.

In a further embodiment, the computer generates an event map illustrating ingress/leak events within a geographical area using information extracted from different radio signals.

Features and advantages of the subject matter hereof will become more apparent in light of the following detailed description of selected embodiments, as illustrated in the accompanying figures. As will be realized, the subject matter disclosed and claimed is capable of modifications in various respects, all without departing from the scope of the claims. Accordingly, the drawings and the description are to be regarded as illustrative in nature, and not as restrictive and the full scope of the subject matter is set forth in the claims.

BRIEF DESCRIPTION OF THE DRAWINGS

Further features and advantages of the present disclosure will become apparent from the following detailed description, taken in combination with the appended drawings, in which.

It will be noted that throughout the appended drawings, like features are identified by like reference numerals.

DETAILED DESCRIPTION

Figure 1:
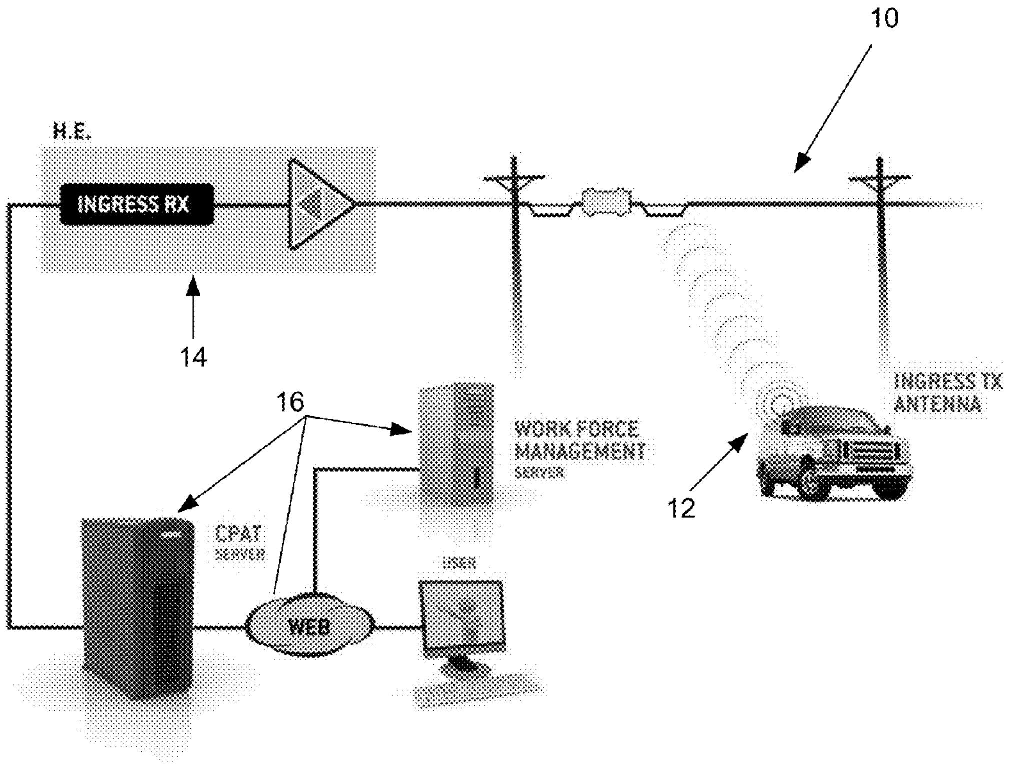
FIG. 1 is a schematic diagram which illustrates an example of a system for detecting signal ingress interferences in accordance with an embodiment.

The present document describes a system and method for detecting and geo-locating signal ingress interferences in a cable distribution network. The cable distribution network comprises a head station for transmitting content to subscribers at frequencies within a network bandwidth. The system comprises a vehicle mounted geo-locating device for generating geo-location data indicating the geographical position of a vehicle, and a vehicle mounted transmitter for transmitting a radio-frequency signal comprising said geo-location data using a carrier frequency within the network bandwidth as the vehicle travels within the geographical area of the network. If an ingress exists in the network, the ingress signal sent from onboard the vehicle would leak into the network and travel therein until it reaches a receiver installed at the head station of the cable distribution network. The receiver detects the radio signal and extracts therefrom the geo-location data indicating the position the vehicle was at when the ingress signal was transmitted. In an embodiment, the receiver quantifies the relative level of the ingress source. A server is used to process the data extracted by the receiver to produces reports and maps reflecting ingress points in a geographical area.

In an embodiment, the system may further comprise a server implementing a web based management application for processing the extracted geo-location information and identifying an ingress within the cable distribution network. The web based management application may also be used to eliminate duplicates of the same ingress to avoid sending more than one repair team to the same ingress. In an embodiment the system generates an event map illustrating ingress/leak events within a geographical area.

In one aspect, the system for detecting signal ingress interferences is provided as a kit. The kit may comprise a vehicle mounted geo-locating device, e.g. GPS, for identifying the location of the vehicle as the vehicle moves in the geographical area of the network, a wireless transmitter for transmitting the location of the vehicle as the vehicle is moving, an ingress detection receiver for detecting signals transmitted by the vehicle mounted transmitter which leaked into the cable distribution network through an ingress. The receiver may be installed at the head station of the cable distribution network, where cable signals are transmitted in the network. When the receiver detects a signal, it extracts the geo-location information transmitted in the signal for identifying the location of ingress.

In an embodiment, the kit may comprise a memory (CD, USB Key, or any other form of physical media) having recorded thereon computer readable instructions which, when executed by a processor, cause the processor to generate an event map illustrating ingress/leak events within a geographical area.

In a variation of this embodiment, the receiver groups recorded ingress points and transfers them through an internet access to a remote CPAT processing server. The processing server filters already known points and adds new ones in the database. The CPAT processing server produces reports and maps reflecting active content of the database.

The geo-locating device and the transmitter may be provided as separate components and may also be operatively combined with each other in a single unit.

Referring now to the drawings, FIG. 1 illustrates an example of an ingress locating system for detecting signal ingress interferences in accordance with an embodiment. In the embodiment shown in FIG. 1, the ingress locating system 10 includes a vehicle based transmitter (ITX1) 12 (combined with a geo-locating device), a head-end located ingress detection receiver (IRX1) 14 and a server 16 implementing a web based management application (CPAT™). The server may be in communication with a database or other servers and computers via a communication network such as the internet. The head-end ingress receiver 14 detects measures and localizes ingress events based on the ingress signals received at the receiver. The transmitter 12 transmits an over-the-air carrier containing the GPS coordinates of the vehicle position while the technician is driving out the plant during his daily work routine. In an embodiment, transmission of data (including the GPS coordinates) by the transmitter 12 lasts 6 ms to 8 ms. Transmission of data is repeated every 93 ms to 99 ms (96 ms±3 ms) in order to reduce repetitive collisions between transmission of multiples transmitters 12 in the same area. It is possible to accommodate a large number of vehicle mounted transmitters 12 provided in different vehicles. In an embodiment, the system may accommodate up to 500 transmitters 12 provided in different vehicles within the same cable plant. When the vehicle is driving in an ingress prone area, the transmitted signal enters the coaxial plant and travels up to the head-end location. Once identified, the signal is measured and decoded by the head-end ingress receiver 14. The information is then forwarded to the server 16.

In a non-limiting example of implementation, the user may select one or more of the following carriers for sending the ingress test signals:

a. 6.78 MHz+/−15 kHz (15000 μV/m @ 30 m)
b. 13.56 MHz+/−10 kHz (15848 μV/m @ 30 m)
c. 27.12 MHz+/−15 kHz (10000 μV/m @ 3 m)

The power density of the transmitted signal should not exceed regulated limits for unintended emissions and yet, it should be strong enough to be detected and decoded by the head-end ingress receiver 14. In an embodiment, the power density is adjustable. A preliminary evaluation of the operator's system upstream frequency allocation content may be performed to define upstream transmission frequency to avoid any interferences with operator services. Even if the transmitted level is very low, ingress test signals have to avoid the occupied upstream bands.

In an embodiment, the system employs Differential Binary Phase-Shift Keying (DBPSK) modulation. For example, the system sends a pilot signal for duration of 1 ms followed by a 180° phase shift to allow the receiver to synchronize. After synchronization, the receiver begins to decode the data message using DBPSK demodulation. The data message may include 68 bits representing the unique identifier of the vehicle, positional information generated by the GPS, e.g. latitude and longitude, cyclic redundancy check (CRC) etc. It should be noted that the system is not limited to DBPSK and that other modulation-demodulation techniques may be used. However, the DBPSK is cheaper to implement in addition to being the most robust of all the PSKs against noise because it requires the highest level of noise to make the demodulator reach an incorrect decision.

Figure 2:
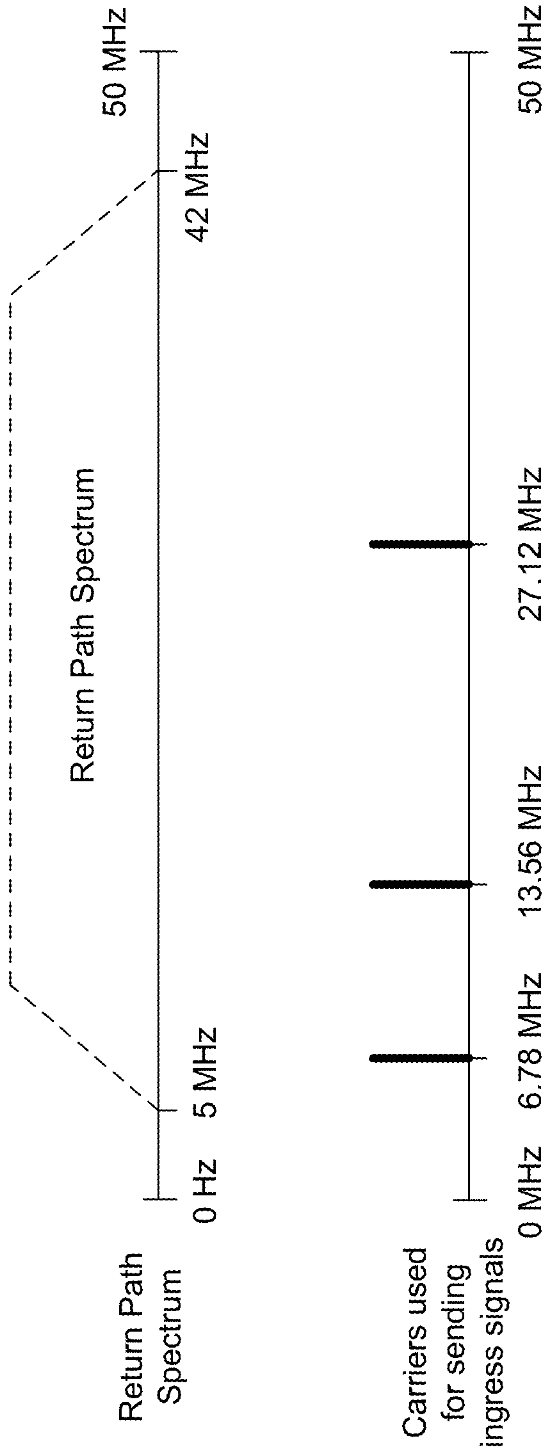
FIG. 2 is a graphical illustration of possible carrier frequencies in the return path spectrum that may be used for sending ingress signals.
Figure 3:
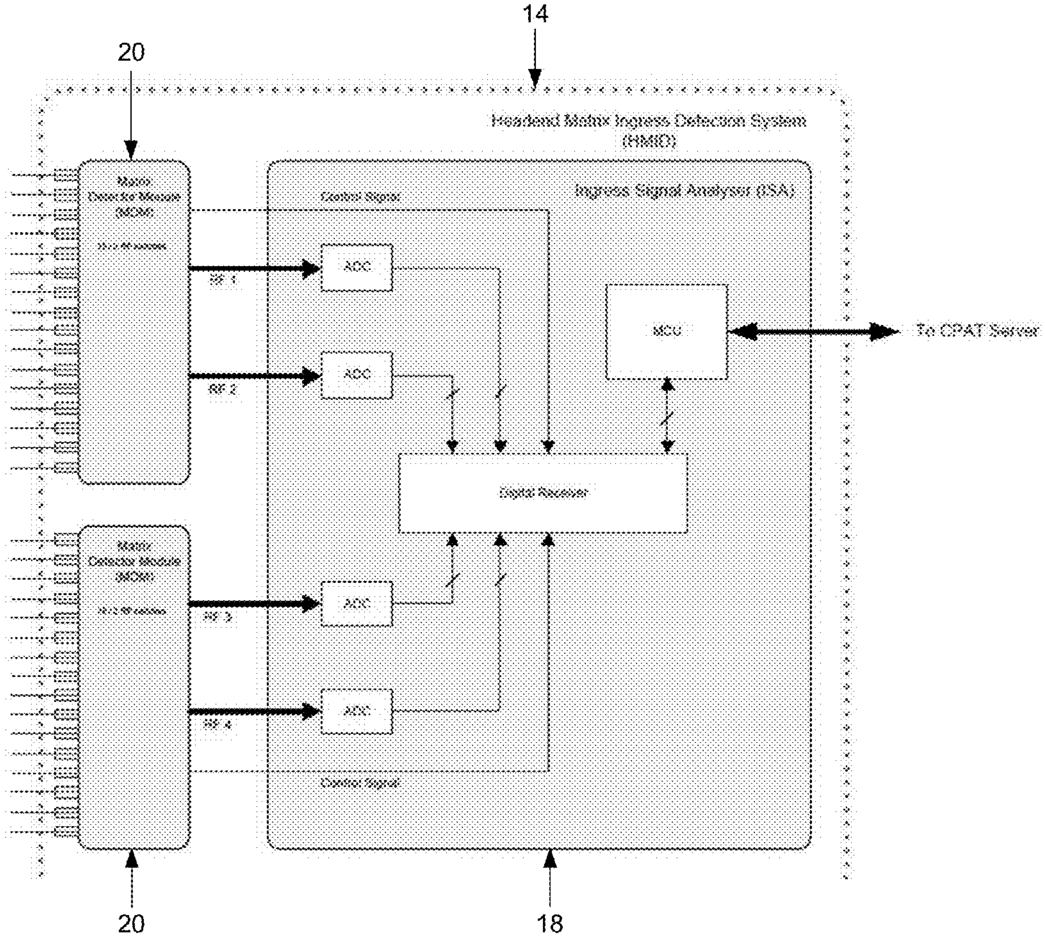
FIG. 3 is an exemplary schematic diagram of Head-end Matrix Ingress Detection System.

FIG. 2 is a graphical illustration of possible carrier frequencies in the return spectrum for sending ingress signals. In the example of FIG. 2, the return path spectrum is between 5 and 42 MHZ, and the possible carrier frequencies include 6.78 MHz (with bandwidth extending between +/−15 KHZ), 13.56 MHZ (with bandwidth extending between +/−10 KHZ), and 27.12 MHZ (with bandwidth extending between +/−15 KHZ). As stated above, the user may select one or more of these carriers for sending the ingress test signals. FIG. 3 is an exemplary schematic diagram of Head-end Matrix Ingress Detection System (referred to herein as the head-end ingress receiver 14).

As shown in FIG. 3, the front end of the head-end ingress receiver 14 includes two RF matrix pre-detection circuits 20 through which 2×16 return channels (nodes outputs) pass. In a situation where the shielding integrity of the coaxial plant is defective or insufficient, the ingress pilot signal detected on a channel is quickly switched to an Ingress Signal Analyzer (ISA) 18. The analyzer 18 can then measure the ingress test signal level and decode the entire ingress test signal information (ID, Lat-Long Coordinates). The ingress event information is uploaded to the CPAT web server 16 database. Each head-end ingress receiver 14 can monitor up to 32 return channels. In an embodiment, the head-end ingress receiver 14 measures the power level of the radio signal and the server 16 uses the power levels of successive signals sent by the same vehicle to determine an approximate location of an ingress. For example, consider the case where five successive measurements were received from the same vehicle from locations A, B, C, D, and E. The receiver measures the power level of the signal associated with each location and stores this data in a database. The server 16 then compares the power levels to find a trend and determine an approximate location of the ingress accordingly. For example, if the power increases from A to B, then from B to C, and decreases from C to D, and from D to E, the server may determine than location C is the closest to the ingress. This information may help the technician narrow down the search and locate the ingress faster.

In another example of implementation, the head-end ingress receiver 14 starts a new ingress point while receiving measurements from the transmitter 12. The head-end ingress receiver 14 then compares the measurements until the signal is below a specific threshold. Subsequently, the head-end ingress receiver 14 stores a new ingress point where maximum level was measured, using level, time and geo-location. The ingress points stored may then be sent to the remote server 16 periodically for processing.

The initial planning/configuration phases may include one or more of the following activities, in accordance with an exemplary implementation:

Send technical configuration document to the operator to document return path usage.

Analyze technical configuration document to optimize and propose a narrow-band upstream subcarrier frequency to avoid interfering with operator's return band services.

Evaluate number of required transmitters 12 and receivers 14 for proper performance according to number of nodes present in the return path.

Installation and wiring of equipment into head-end and vehicles.

Configure spectral utilization and RF levels of upstream carrier frequency into transmitters 12 and receivers 14 firmware.

Geo-fence system/node upstream carrier frequencies into transmitters 12 firmware to allow automatic switching of frequencies when entering a node or system with different upstream frequency allocation.

Test communication directly between transmitters 12 and receivers 14 at the head-end.

Test transmitters 12 and receivers 14 communication in a test node by connecting the transmitters 12 directly to a test tap or subscriber connection location. Ingress test point should be operated for a minimum of 24 hrs to insure non-interfering operation with current upstream services of broadband operator.

Once non-interfering testing is conclusive, deploy ITX1 equipped vehicles in all nodes.

Start ingress monitoring.

In operation, once transmitter 12 equipped vehicles start driving in the system plant, the transmitters' RF matrix pre-detection circuit will be looking for the selected frequencies pilot carriers. If the shielding integrity of the coaxial plant is defective or inappropriate, the pilot carrier transmitted through the vehicle antenna will enter the return plant of the broadband operator and be uploaded up to the head-end location. Once received at the input of the receiver 14, the RF matrix pre-detection circuit will detect the presence of the selected frequency pilot carrier which will be switched to an ingress signal analyzer (ISA). The analyzer will measure the ingress test signal level and decode the vehicle ID and localization in real-time.

The data collected and stored (extracted geolocation information) is processed by the CPAT application server to eliminate multiple appearances of the same ingress event that could have been previously detected or detected by any other of vehicle part of the operator's fleet. This post-processing will avoid sending multiple technicians to same recurring ingress event localization. Ingress repairs can be dispatched by the CPAT application server 16. The CPAT application server 16 can manage the status of dispatched or repaired ingress events. Ingress repairs could also be dispatched to a work force management system via a data interface.

In a situation where a broadband cable operator vehicle fleet is covering multiple systems with different upstream frequency allocations, it is possible to geo-fence these systems into the CPAT database to reflect proper upstream frequency allocation of each system. Once all systems are geo-fenced, the CPAT™ Ingress Locator will use the appropriate upstream transmission frequency in the system being driven.

For example, if a vehicle is moving out of zone 'A' to enter zone 'B', the transmitter 12 will instantly switch zone 'A' upstream carrier frequency to zone 'B' carrier frequency. The CPAT Ingress Locator can also utilize its geo-fencing capability for nodes using different upstream frequency allocation within the same system plant.

Figure 4:
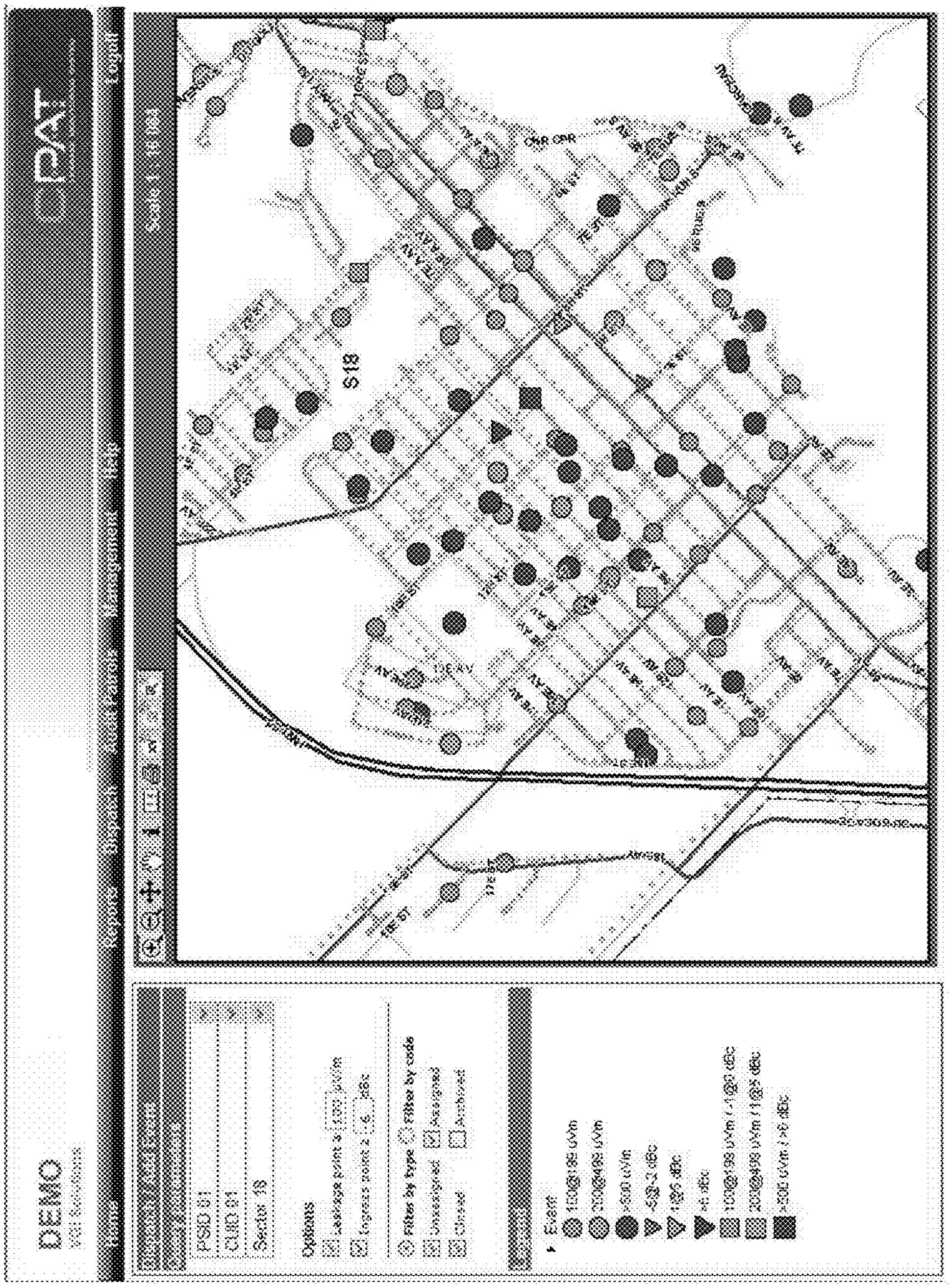
FIG. 4 is an exemplary illustration of an Event Map showing ingress/leak events identified by color and form legend.

FIG. 4 is an exemplary illustration of an Event Map showing ingress/leak events identified by color and form legend within a geographical area. The map indicates the event type and the location thereof. As discussed above, the transmitter 12 is coupled to a GPS to send the geo-location of the vehicle at the time the signal was transmitted. Therefore, when the signal is received, the location data is extracted from the signal to determine the approximate location of the leak. The events are sorted in accordance with their type and signal strength as received at the receiver. Different shapes and colors may be used to indicate the type of event and signal strength as received at the receiver 14. Examples of possible events are shown in the legend section of the map illustrated in FIG. 4.

The ingress locating system 10 provides several advantages over the prior methods for detecting signal ingress interferences. These advantages include:

No dedicated resources assigned to ingress patrols: The CPAT™ Ingress Locator solution uses the technician's driving time more efficiently.

Completely automatic and hands-free operation: The CPAT™ Ingress Locator onboard device requires no intervention from field technicians to locate ingress impairments.

Full operating flexibility for any upstream system: Since CPAT™ Ingress Locator equipped vehicles are using GPS based technology, the transmitter 12 will instantly switch to proper upstream carrier frequency when entering a system or node using a different upstream frequency allocation.

Daily monitoring and repair of ingress events: Makes the preventive maintenance program more efficient by shortening the lifecycle of ingress and reducing the number of service calls.

Reduced subscriber down-time: Since CPAT™ Ingress Locator can localize ingress events to a specific radius area on a digital map. There is a significant reduction of subscriber's service(s) downtime when compared to 'older troubleshooting methods' which disrupted more subscribers living under a larger portion of the distribution network under ingress troubleshooting, and especially if network is not constructed with RF/AC bypass taps.

Reduced troubleshooting time: Since CPAT™ Ingress Locator can localize ingress events to a specific location on a map; there is a significant reduction in number of plant cutoff iterations when trying to breakdown the localization of the ingress source.

Proactive plant maintenance: Since CPAT™ Ingress Locator works on a continuous basis; operator will detect ingress events before they can disrupt subscriber service delivery and generate service calls.

Figure 5:
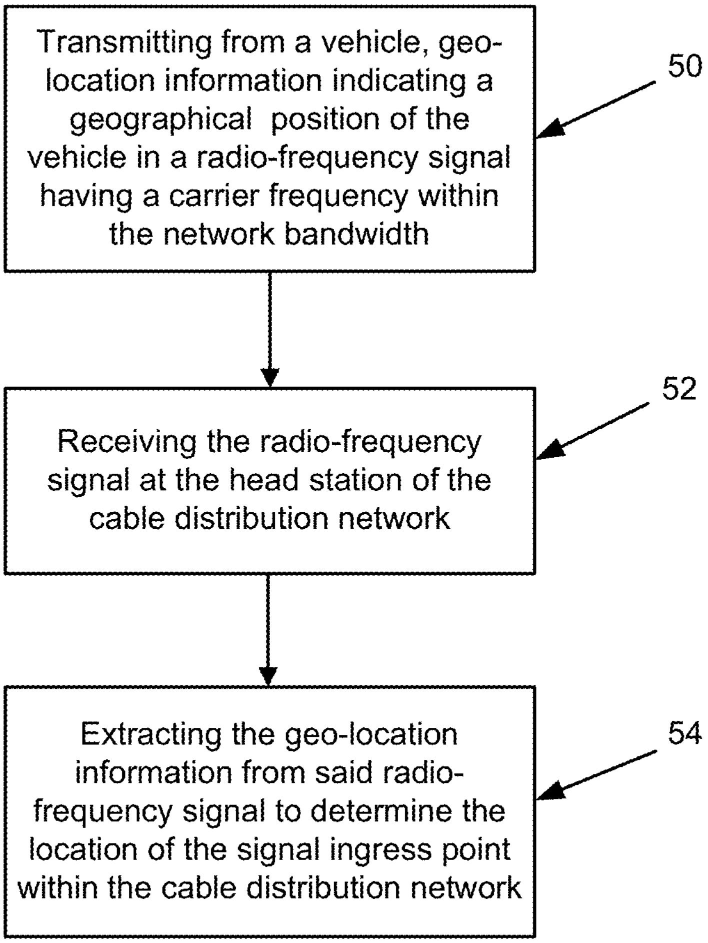
FIG. 5 is a block diagram of a method of detecting signal ingress interferences in accordance with an embodiment.

FIG. 5 is a flowchart illustrating the steps of a method for locating a signal ingress point within a cable distribution network. Step 50 includes transmitting from a vehicle, geo-location information indicating a geographical position of the vehicle in a radio-frequency signal having a carrier frequency within the network bandwidth. Step 52 includes receiving the radio-frequency signal at the head station of the cable distribution network. Step 54 includes extracting the geo-location information from said radio-frequency signal to determine the location of the signal ingress point within the cable distribution network.

Objectives achieved by the system and method described herein include:

Ability to adapt to an upstream frequency plan used by broadband cable operator;

Non-interfering to any return services provided by broadband cable operator;

Robust digital modulation scheme to perform under severe noise conditions;

Using Available frequencies in the lower noisy part of the return band;

Ingress test signal frequencies, burst time and transmitted power compliant with FCC regulation;

Continuous patrol mode (random driving) during daily technician work routine;

Fully autonomous monitoring system requiring no intervention from technician;

Identify vehicle position within 6 feet radius from where ingress was detected;

Multiple and concurrent vehicle monitoring operation; and

Minimize equipment footprint and cost at the head-end.

The embodiments described herein can be implemented as a computer program product for use with a computer system. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or electrical communications lines) or a medium implemented with wireless techniques (e.g., microwave, infrared or other transmission techniques). The series of computer instructions embodies all or part of the functionality previously described herein. Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies. It is expected that such a computer program product may be distributed as a removable medium with accompanying printed or electronic documentation (e.g., shrink wrapped software), preloaded with a computer system (e.g., on system ROM or fixed disk), or distributed from a server over the network (e.g., the Internet or World Wide Web). Of course, some embodiments of the invention may be implemented as a combination of both software (e.g., a computer program product) and hardware. Still other embodiments of the invention may be implemented as entirely hardware, or entirely software (e.g., a computer program product).

While preferred embodiments have been described above and illustrated in the accompanying drawings, it will be evident to those skilled in the art that modifications may be made therein without departing from the scope of this disclosure. Such modifications are considered as possible variants comprised in the scope of the disclosure.

The invention claimed is:

1. A system for locating a signal ingress point within a cable distribution network, the signal ingress point having a location, the cable distribution network comprising a head station for receiving from subscribers upstream transmissions at frequencies within an upstream band, the system comprising:

a geo-locating device mounted on a vehicle for generating geo-location data indicating a geographical position of the vehicle;

a transmitter mounted on a vehicle and operatively connected to the geo-locating device for repeatedly transmitting a radio signal at a given rate for entering the cable distribution network through the signal ingress point and for traveling in the cable distribution network, the radio signal comprising geo-location information representing the geographical position of the vehicle, the radio signal using a carrier frequency within the upstream band, the transmitter being adapted for transmitting a pilot signal prior to each transmitting of the radio signal; and a receiver at the head station of the cable distribution network, for receiving the radio signal through the cable distribution network, and extracting the geo-location information to determine the location of the signal ingress point within the cable distribution network, and prior to receiving the radio signal, receiving the pilot signal for synchronization;

wherein the receiver comprises a RF matrix pre-detection circuit through which a plurality of channels pass for receiving the pilot signal traveling in one of the channels, wherein the RF matrix pre-detection circuit switches the channel in which the pilot signal is traveling to a signal analyzer for receiving the radio signal.

2. The system of claim 1, wherein the carrier frequency is unused by the cable distribution network.

3. The system of claim 1, further comprising a server for processing the extracted geo-location information and identifying an ingress within the cable distribution network.

4. The system of claim 3, wherein the server is adapted to eliminate duplicates of the same ingress to avoid sending more than one repair team to the same ingress.

5. The system of claim 1, wherein the transmitter uses different carrier frequencies with adjacent distribution networks.

6. The system of claim 1, further comprising a server having access to a database for recording ingress/leak events in the database, said server being adapted to generate an event map illustrating ingress/leak events within a geographical area using the ingress/leak events stored in the database.

7. The system of claim 6, wherein the receiver measures a power level of said radio signal and the server determines an approximate location of the signal ingress point based on the power level of successive radio signals received from the same vehicle.

8. The system of claim 1, wherein the radio signal transmitted by the transmitter comprises identification information of the vehicle.

9. The system of claim 1, wherein the radio signal is modulated using Differential Binary Phase-Shift Keying (DBPSK) modulation.

10. The system of claim 1, wherein the network has a bandwidth between 5 and 42 MHZ and the carrier frequency is selected from: 6.78 MHz, 13.56 MHZ, and 27.12 MHZ.

11. A method for locating a signal ingress point within a cable distribution network, the signal ingress point having a location, the cable distribution network comprising a head station for receiving from subscribers upstream transmissions at frequencies within an upstream band, the method comprising:

repeatedly transmitting at a given rate from a vehicle a pilot signal and geo-location information indicating a geographical position of the vehicle in a radio signal for entering the cable distribution network through the signal ingress point and traveling in the cable distribution network, the radio signal having a carrier frequency within the upstream band;

synchronizing a receiver at the head station of the cable distribution network, the receiver being adapted to receive said pilot signal;

receiving the radio signal at the head station of the cable distribution network through the cable distribution network; and extracting geo-location information from said radio signal to determine the location of the signal ingress point within the cable distribution network;

wherein synchronizing a receiver comprises receiving the pilot signal traveling in a channel of the cable distribution network on a RF matrix pre-detection circuit through which a plurality of channels pass, and switching the channel in which the pilot signal is traveling to a signal analyzer for receiving the radio signal comprising geo-location information.

12. The method of claim 11, further comprising at least one of sending vehicle identification information along with said geo-location information and determining an approximate location of the signal ingress point based on the power level of successive radio signals received from the same vehicle.

13. The method of claim 11, further comprising storing ingress/leak events and geographical positions associated therewith in a database and generating an event map illustrating ingress/leak events within a geographical area.

14. A kit for locating a signal ingress point within a cable distribution network, the cable distribution network comprising a head station for receiving from subscribers upstream transmissions at frequencies within an upstream band, the kit comprising:

a transmitter for mounting on a vehicle for repeatedly transmitting a radio signal at a given rate for entering the cable distribution network through the signal ingress point and traveling in the cable distribution network, the radio signal comprising geo-location information indicating a geographical position of the vehicle, the radio signal using a carrier frequency within the upstream band, the transmitter being adapted for transmitting a pilot signal prior to each transmitting of the radio signal;

a receiver for installing at the head station of said cable distribution network for receiving said radio signal through the cable distribution network, and extracting said geo-location information, and prior to receiving the radio signal, receiving the pilot signal for synchronization; and a memory having recoded thereon statements and instructions for execution by a computer to cause the computer to process the geo-location information to determine an approximate location of said signal ingress point within the cable distribution network;

wherein the receiver comprises a RF matrix pre-detection circuit through which a plurality of channels pass for receiving the pilot signal traveling in one of the channels, wherein the RF matrix pre-detection circuit switches the channel in which the pilot signal is traveling to a signal analyzer for receiving the radio signal.

15. The kit of claim 14, further comprising a geo-locating device for mounting on the vehicle for generating the geo-location information.

16. The kit of claim 14, wherein the computer determines the approximate location of the signal ingress point based on the power level of successive radio signals received from the same vehicle.

17. The kit of claim 14, wherein the computer generates an event map illustrating ingress/leak events within a geographical area using information extracted from the radio signals corresponding to different ingress/leak events.

* * * * *